US009431365B2

(12) United States Patent
Seok et al.

(10) Patent No.: US 9,431,365 B2
(45) Date of Patent: Aug. 30, 2016

(54) APPARATUS FOR BONDING SEMICONDUCTOR CHIPS

(71) Applicants: Seung-dae Seok, Yongin-si (KR); Sang-yoon Kim, Suwon-si (KR); Hui-jae Kim, Seoul (KR); Jae-bong Shin, Gunpo-si (KR)

(72) Inventors: Seung-dae Seok, Yongin-si (KR); Sang-yoon Kim, Suwon-si (KR); Hui-jae Kim, Seoul (KR); Jae-bong Shin, Gunpo-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/700,251

(22) Filed: Apr. 30, 2015

(65) Prior Publication Data

US 2016/0079199 A1    Mar. 17, 2016

(30) Foreign Application Priority Data

Sep. 16, 2014 (KR) ........................ 10-2014-0122936

(51) Int. Cl.
*B23K 31/02* (2006.01)
*B23K 37/00* (2006.01)
*H01L 23/00* (2006.01)
*B23K 3/08* (2006.01)
*B23K 3/04* (2006.01)
*B23K 1/00* (2006.01)

(52) U.S. Cl.
CPC ................. *H01L 24/75* (2013.01); *B23K 1/00* (2013.01); *B23K 3/04* (2013.01); *B23K 3/085* (2013.01); *H01L 24/81* (2013.01); *H01L 2224/7565* (2013.01); *H01L 2224/75501* (2013.01); *H01L 2224/75702* (2013.01); *H01L 2224/75753* (2013.01); *H01L 2224/75824* (2013.01); *H01L 2224/75901* (2013.01); *H01L 2224/8118* (2013.01); *H01L 2224/81121* (2013.01); *H01L 2224/81203* (2013.01); *H01L 2224/81908* (2013.01)

(58) Field of Classification Search
None
See application file for complete search history.

(56) References Cited

U.S. PATENT DOCUMENTS

| | | | | |
|---|---|---|---|---|
| 6,129,259 A | * | 10/2000 | Stansbury | H01J 9/241 228/105 |
| 6,193,132 B1 | * | 2/2001 | Shibata | B23K 3/04 228/103 |
| 6,266,891 B1 | * | 7/2001 | Yamamoto | H01L 21/681 33/286 |
| 6,337,221 B1 | * | 1/2002 | Kim | H01L 21/67144 257/E21.525 |
| 6,337,489 B1 | * | 1/2002 | Matsumoto | H01L 21/67144 228/105 |

(Continued)

FOREIGN PATENT DOCUMENTS

| | | |
|---|---|---|
| JP | 2006-216573 A | 8/2006 |
| JP | 2006-310480 A | 11/2006 |

(Continued)

*Primary Examiner* — Kiley Stoner
(74) *Attorney, Agent, or Firm* — Lee & Morse, P.C.

(57) ABSTRACT

A semiconductor chip bonding apparatus includes a bonding head to adsorptively pick up a semiconductor chip, a bonding stage supporting a substrate, the semiconductor chip to be bonded to the substrate on the bonding stage, a first camera to capture an image of the semiconductor chip and to obtain positional information regarding the semiconductor chip, a second camera to capture an image of the substrate and to obtain positional information regarding the substrate, a correction device structure at a first side surface of the bonding stage, the correction device structure including a correction substrate and at least one correction chip, and a bonding controller to control pick up of the at least one correction chip by the bonding head, mounting of the at least one correction chip on the correction substrate, and correcting of a bonding position.

20 Claims, 8 Drawing Sheets

(56) References Cited

U.S. PATENT DOCUMENTS

| | | | |
|---|---|---|---|
| 6,358,128 B1* | 3/2002 | Sakurai | B24B 37/042 257/E21.23 |
| 6,389,688 B1* | 5/2002 | Srivastava | H01L 21/681 29/720 |
| RE39,775 E * | 8/2007 | Kato | C23C 14/564 34/406 |
| 8,133,823 B2 | 3/2012 | Behler et al. | |
| 8,251,484 B2 | 8/2012 | Mizes | |
| 8,653,444 B2 | 2/2014 | Minoz et al. | |
| 2002/0131848 A1* | 9/2002 | Kurata | H01L 21/67288 414/217 |
| 2004/0261947 A1* | 12/2004 | Haraguchi | H01L 24/75 156/351 |
| 2006/0215152 A1* | 9/2006 | Hashimoto | H01L 21/681 356/237.2 |
| 2007/0101572 A1* | 5/2007 | Kabeshita | H01L 21/67132 29/832 |
| 2008/0040917 A1* | 2/2008 | Narita | H01L 21/67132 29/740 |
| 2009/0098667 A1* | 4/2009 | Behler | G05B 19/4015 438/15 |
| 2010/0000081 A1* | 1/2010 | Noda | H01L 24/75 29/739 |
| 2010/0008688 A1* | 1/2010 | Kimura | H01L 21/68 399/66 |
| 2010/0047053 A1* | 2/2010 | Burke | H01L 21/67144 414/787 |
| 2010/0122455 A1* | 5/2010 | Noda | H01L 21/67144 29/832 |
| 2010/0257728 A1* | 10/2010 | Hiraki | H01L 24/27 29/739 |
| 2010/0263209 A1* | 10/2010 | Shimoyoshi | H01L 21/67144 29/832 |
| 2011/0061227 A1* | 3/2011 | Tsou | H01L 21/681 29/705 |
| 2011/0132169 A1 | 6/2011 | Kapoor et al. | |
| 2011/0263133 A1* | 10/2011 | Hara | H01L 21/67028 438/758 |
| 2012/0002057 A1 | 1/2012 | Kakinami | |
| 2012/0214258 A1* | 8/2012 | Kihara | H01L 21/67144 438/5 |
| 2013/0004269 A1 | 1/2013 | Van Zwet et al. | |
| 2013/0148878 A1* | 6/2013 | Lin | G06T 7/0028 382/151 |
| 2013/0183121 A1* | 7/2013 | Isomura | H01L 21/67745 414/217 |
| 2013/0291378 A1* | 11/2013 | Higashizawa | H05K 13/04 29/832 |
| 2014/0022362 A1 | 1/2014 | Oellers | |
| 2014/0033955 A1 | 2/2014 | He et al. | |
| 2014/0071580 A1* | 3/2014 | Higginson | B81C 99/002 361/234 |
| 2014/0154037 A1* | 6/2014 | Sen | H01L 21/67144 414/744.2 |
| 2015/0139758 A1* | 5/2015 | Ito | H01L 21/6776 414/222.02 |
| 2015/0179584 A1* | 6/2015 | Woerz | H01L 22/12 257/797 |
| 2015/0279748 A1* | 10/2015 | Spath | H01L 21/78 438/14 |
| 2015/0287625 A1* | 10/2015 | Fujimoto | G01B 11/002 382/151 |
| 2015/0289426 A1* | 10/2015 | Mantani | H05K 13/0465 228/9 |

FOREIGN PATENT DOCUMENTS

| | | |
|---|---|---|
| JP | 2007-012802 A | 1/2007 |
| JP | 2009-200377 A | 9/2009 |
| JP | 2010-153562 A | 7/2010 |
| JP | 2011-198981 A | 10/2011 |
| JP | 2013-125866 A | 6/2013 |
| JP | 2014-007329 A | 1/2014 |
| KR | 10-2002-0090813 A | 12/2002 |
| KR | 10-2005-0097574 A | 10/2005 |
| KR | 10-2006-0003165 A | 1/2006 |
| KR | 10-2008-0096984 A | 11/2008 |
| KR | 10-2014-0022582 A | 2/2014 |

* cited by examiner

APPARATUS FOR BONDING SEMICONDUCTOR CHIPS

CROSS-REFERENCE TO RELATED APPLICATION

Korean Patent Application No. 10-2014-0122936, filed on Sep. 16, 2014, in the Korean Intellectual Property Office, and entitled: "Apparatus For Bonding Semiconductor Chips," is incorporated by reference herein in its entirety.

BACKGROUND

1. Field

Embodiments relate to an apparatus for bonding semiconductor chips (hereinafter, referred to as a semiconductor chip bonding apparatus), and more particularly, to a semiconductor chip bonding apparatus, which includes a correction device configured to correct a bonding position of a semiconductor chip.

2. Description of the Related Art

To achieve low power consumption and high driving speed, a semiconductor chip bonding process for bonding semiconductor chips or semiconductor packages has been changed from a contact connection method using a wire bonding process into a connection method using through-silicon vias (TSVs). The connection method using TSVs includes a flip-chip bonding process of bringing bumps into direct contact with pads.

SUMMARY

According to an aspect of embodiments, there is provided a semiconductor chip bonding apparatus includes a bonding head to adsorptively pick up a semiconductor chip, a bonding stage supporting a substrate, the semiconductor chip to be bonded to the substrate on the bonding stage, a first camera to capture an image of the semiconductor chip and to obtain positional information regarding the semiconductor chip, a second camera to capture an image of the substrate and to obtain positional information regarding the substrate, a correction device structure at a first side surface of the bonding stage, the correction device structure including a correction substrate and at least one correction chip, and a bonding controller to control pick up of the at least one correction chip by the bonding head, mounting of the at least one correction chip on the correction substrate, and correcting of a bonding position.

The correction device structure may include a fixing unit on which the correction chip and the correction substrate are disposed and to which the correction chip and the correction substrate are fixed, and a body unit connected to one side of the bonding stage.

The correction device structure may further include a fixing member formed on two side surfaces of the correction substrate in a first direction. The fixing member may fix the correction substrate.

The correction device structure may include a cooling unit formed between the fixing unit and the body unit and configured to cool the correction chip and the correction substrate.

The correction chip and the correction substrate may be adsorptively supported by the correction device structure, and are capable of being attached and detached.

Regions of the correction substrate in which correction chips are mounted may be arranged in a row in a first direction.

The correction chip and the correction substrate may be formed of a transparent material.

The semiconductor chip bonding apparatus may further include a first transfer device connected to the bonding head and the second camera and configured to transfer the bonding head and the second camera in a first direction.

The first transfer device may have a gantry structure, and the first camera may be an up-looking camera disposed under the first transfer device and configured to capture images in an upward direction.

The semiconductor chip bonding apparatus may further include a second transfer device connected to the bonding stage and the correction device structure and configured to transfer the bonding stage and the correction device structure in a second direction perpendicular to the first direction.

According to another aspect of embodiments, there is provided a method of operating a semiconductor chip bonding apparatus. The method includes adsorptively picking up semiconductor chips with a bonding head, mounting the semiconductor chips on a semiconductor substrate disposed on a bonding stage, correcting positions of the semiconductor chips on the semiconductor substrate, and applying heat and pressure to the semiconductor chips, such that the semiconductor chips are bonded to the semiconductor substrate, wherein correcting positions of the semiconductor chip, includes transferring the bonding head to face an upper portion of a correction chip, adsorptively picking up the correction chip with the bonding head, obtaining positional information regarding the correction chip by capturing an image of the correction chip with a first camera, transferring a correction substrate formed on one side surface of the bonding stage to a predetermined position, obtaining information regarding a mounting position of the correction substrate by capturing an image of the mounting position of the correction substrate with a second camera, mounting the correction chip in the mounting position of the correction substrate with the bonding head, determining whether the correction chip is precisely mounted in the mounting position of the correction substrate, and calculating a correction offset value when the correction chip is not precisely mounted on the correction substrate to correct chip mounting positions.

The correction of the chip mounting position may be periodically performed during the bonding of the semiconductor chips.

The correction of the chip mounting positions may include applying the correction offset value to the bonding of the semiconductor chips.

The correction offset value may be calculated based on a distance between a fiducial mark formed in the correction chip and a fiducial mark formed in the correction substrate.

The bonding head may be connected to a first transfer device, and transferred by the first transfer device in a first direction. The bonding stage and the correction substrate may be connected to a second transfer device, and transferred by the second transfer device in a second direction perpendicular to the first direction.

According to yet another aspect of embodiments, there is provided a semiconductor chip bonding apparatus including a bonding head to adsorptively pick up a semiconductor chip, a first camera to capture an image of the semiconductor chip on the bonding pad, and to determine a position of the semiconductor chip relative to the bonding head, a bonding stage supporting a substrate, the semiconductor chip being bonded to the substrate on the bonding stage, a second camera to capture an image of the substrate, and to obtain positional information regarding the substrate, a correction device structure connected to the bonding stage, the correction device structure including a correction substrate and at least one correction chip, and a bonding controller to control mounting of the at least one correction chip on the correction substrate, calculating position precision of the correction chip on the correction substrate, and correcting a bonding position of the semiconductor chip on the substrate with respect to the position precision of the correction chip on the correction substrate.

The bonding head adsorptively may pick up both the semiconductor chip and the correction chip, the first camera capturing images of each of the semiconductor chip and of the correction chip relative to the bonding head.

The bonding stage and correction device structure may be simultaneously movable with a same transfer device along a same direction.

The correction substrate and the at least one correction chip may be transparent, each of the at least one correction chip and a mounting position on the correction substrate including a fiduciary mark.

The bonding controller may calculate position precision of the correction chip on the correction substrate in accordance with the fiduciary marks on the correction chip and the correction substrate as captured by the first and second cameras, respectively.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
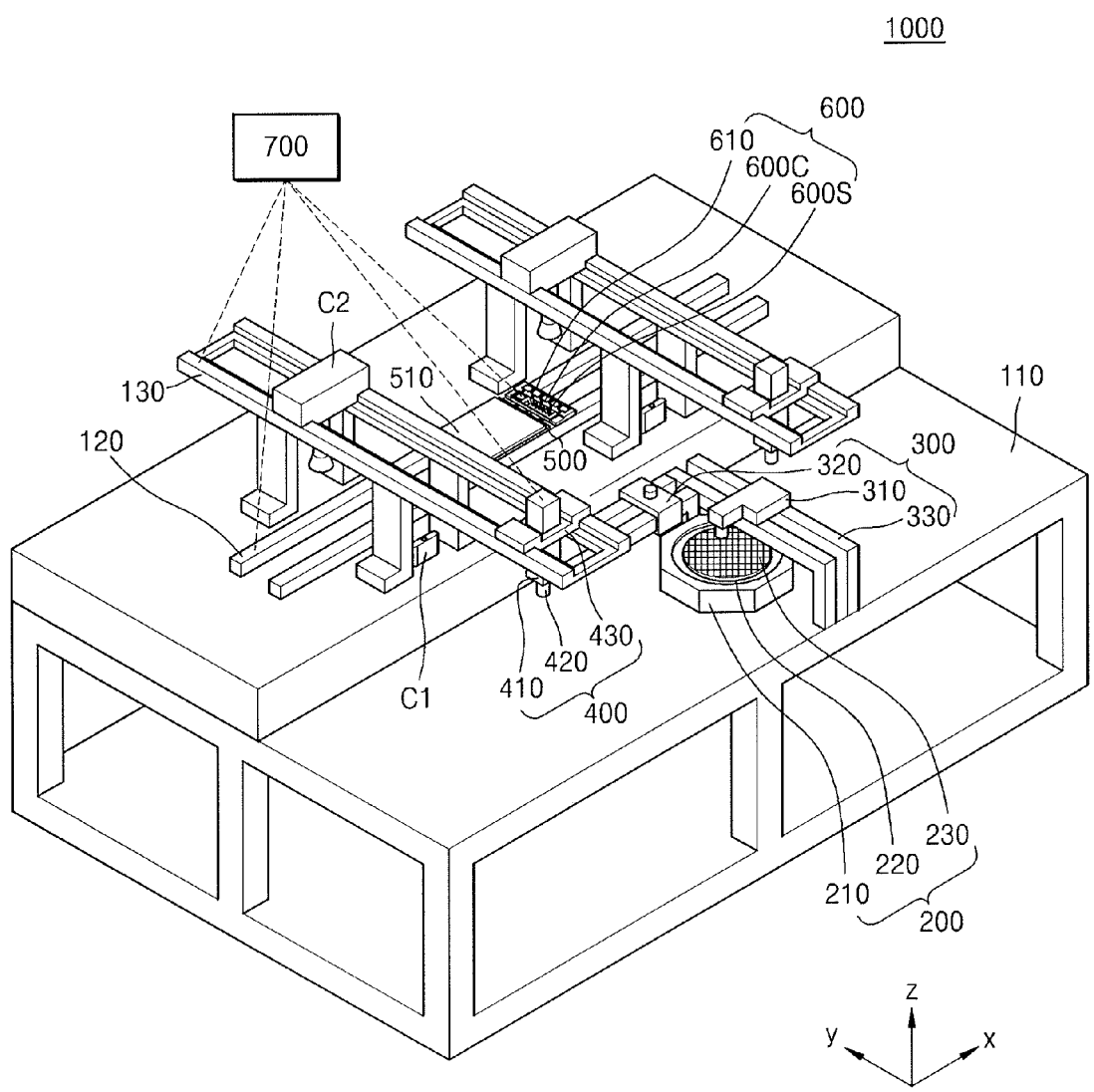
FIG. 1 illustrates a perspective view of a semiconductor chip bonding apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, expressions such as "at least one of," when preceding a list of elements, modify the entire list of elements and do not modify the individual elements of the list.

In the drawings, the size and relative sizes of layers and regions may be exaggerated for clarity of illustration. It will also be understood that when an element is referred to as being "on" or "in contact with" another element, it can be directly on or in direct contact with the other element or intervening elements may be present. In contrast, when an element is referred to as being "directly on" or "in direct contact with" another element, there are no intervening elements present. Other words used to describe the relationship between elements should be interpreted in a like fashion (i.e., "between" versus "directly between", "adjacent" versus "directly adjacent", etc.). Like reference numerals refer to like elements throughout.

It will be understood that, although the terms "first", "second", etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, unless otherwise defined, all terms (including technical and scientific terms) used herein have the same meaning as commonly understood by one of skill in the art.

Hereinafter, exemplary embodiments will be described in detail with reference to the accompanying drawings.

FIG. 1 illustrates a perspective view of a semiconductor chip bonding apparatus 1000 according to an exemplary embodiment. In FIG. 1, elements of the semiconductor chip bonding apparatus 1000 are schematized for brevity, and some elements are omitted or exaggerated.

Referring to FIG. 1, the semiconductor chip bonding apparatus 1000 may include a base unit 110, a first transfer device 120, a second transfer device 130, a wafer supply unit 200, a chip supply unit 300, a bonding head 400, a bonding stage 500, a correction device structure 600, a first camera C1, and a second camera C2. In an embodiment, the semiconductor chip bonding apparatus 1000 may include a controller configured to control the first transfer device 120 and the second transfer device 130, and to correct a position in which a semiconductor chip is mounted on the correction device structure 600.

The base unit 110 may be a fixing unit configured to support the semiconductor chip bonding apparatus 1000. The first transfer device 120, the second transfer device 130, the wafer supply unit 200, the chip supply unit 300, the bonding stage 500, the correction device structure 600, and the first camera C1 may be disposed on the base unit 110.

The first transfer device 120 may be a transfer unit configured to transfer the bonding stage 500 and the correction device structure 600. The first transfer device 120 may be formed on the base unit 110. The first transfer device 120 may include a shaft motor. The first transfer device 120 may extend in a first direction, e.g., in the X direction, on the base unit 110. The first transfer device 120 may drive the shaft motor and transfer the bonding stage 500 and the correction device structure 600 in the first direction, e.g., in the X direction. In an embodiment, the first transfer device 120 may transfer the bonding stage 500 and the correction device structure 600 to a position in which the bonding head 400 is formed, i.e., a position in which the semiconductor chip is mounted, and may transfer the bonding stage 500 and the correction device structure 600 to a position opposite to the bonding head 400 in the first direction, e.g., in the X direction, to be apart from the bonding head 400.

The second transfer device 130 may be a transfer unit configured to transfer the bonding head 400 and the second camera C2. The second transfer device 130 may be formed on the base unit 110. The second transfer device 130 may include a shaft motor.

The second transfer device 130 may extend in a second direction, e.g., in the Y direction, perpendicular to the first direction, e.g., the X direction, on the base unit 110. The second transfer device 130 may drive the shaft motor and transfer the bonding head 400 and the second camera C2. In an embodiment, the second transfer device 130 may independently transfer the bonding head 400 and the second camera C2. The second transfer device 130 may transfer the bonding head 400 to a position to which the bonding stage 400 is transferred, i.e., to a position in which the semiconductor chip is mounted, and transfer the bonding head 400 to be apart from the bonding stage 500 in the second direction, i.e., the Y direction. For example, the first transfer device 120 and the second transfer device 130 may have a gantry structure.

The wafer supply unit 200 may include a wafer stage 210 and a semiconductor wafer 220 with at least one semiconductor chip 230. The wafer stage 210 may keep and support the semiconductor wafer 220. A semiconductor device may be formed on the semiconductor wafer 220. The at least one semiconductor chip 230, e.g., one unit of a plurality of semiconductor chips 230, may be formed by cutting the semiconductor wafer 220 using a sawing machine. A process of cutting the semiconductor wafer 220 may be performed in a separate apparatus from the semiconductor chip bonding apparatus 1000.

The chip supply unit 300 may include a chip picker 310, a chip transport unit 320, and a third transfer device 330. The chip picker 310 may adsorptively pick up the at least one semiconductor chip 230. e.g., pick up the plurality of semiconductor chips 230 one by one, from the wafer stage 210. The chip picker 310 may rotate the semiconductor chip 230 such that top and bottom surfaces of the semiconductor chip 230 are inverted by 180°. The chip picker 310 may transfer the semiconductor chip 230 from the wafer stage 210 to the chip transport unit 320. The chip transport unit 320 may transport the semiconductor chip 230 to the bonding head 400. The chip transport unit 320 may be connected to the third transfer device 330. The third transfer device 330 may transfer the chip transport unit 320 to the vicinity of the bonding head 400.

The bonding head 400 may include a bonding picker 410, an adsorption head 420, and a connection member 430. In an embodiment, a pair of bonding heads 400 having the same structure may be provided and connected to the second transfer device 130. The bonding picker 410 may pick up the semiconductor chip 230 using suction, e.g., vacuum adsorptive power. The bonding picker 410 may move in a third direction, e.g., in the Z direction. The adsorption head 420 may serve as a medium for picking up the semiconductor chip 230, and may be formed to surround an outer side surface portion of the semiconductor chip 230, e.g., the adsorption head 420 may be a collet. The connection member 430 may connect the bonding picker 410 with the second transfer device 130. The bonding head 400 may be connected to the second transfer device 130 and may move in the second direction, e.g., in the Y direction. The bonding head 400 is transferred onto the bonding stage 500 by the second transfer device 130, and moves the semiconductor chip 230, which is picked up by the bonding picker 410, upward and downward in the third direction, e.g., in the Z direction, to mount the semiconductor chip 230 on the bonding stage 500.

A semiconductor substrate 510 including a mounting region, in which the semiconductor chip 230 is to be mounted, may be formed on the bonding stage 500. The bonding stage 500 may be connected to the first transfer device 120 and may move along the first transfer device 120 in the first direction, e.g., the X direction. For example, the semiconductor substrate 510 may be a printed circuit board (PCB).

Figure 2:
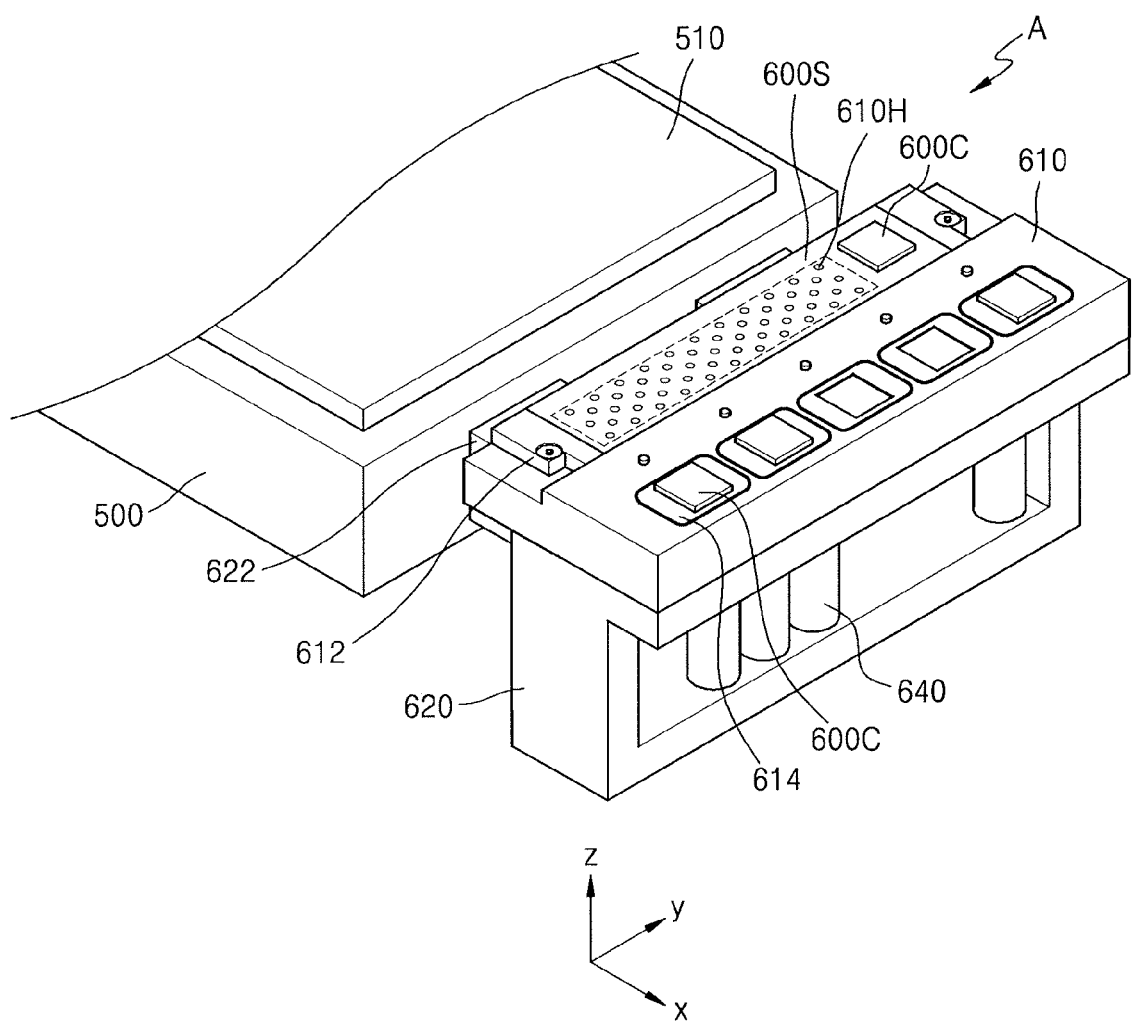
FIG. 2 illustrates an enlarged perspective view of some elements of a semiconductor chip bonding apparatus according to an exemplary embodiment.
Figure 3:
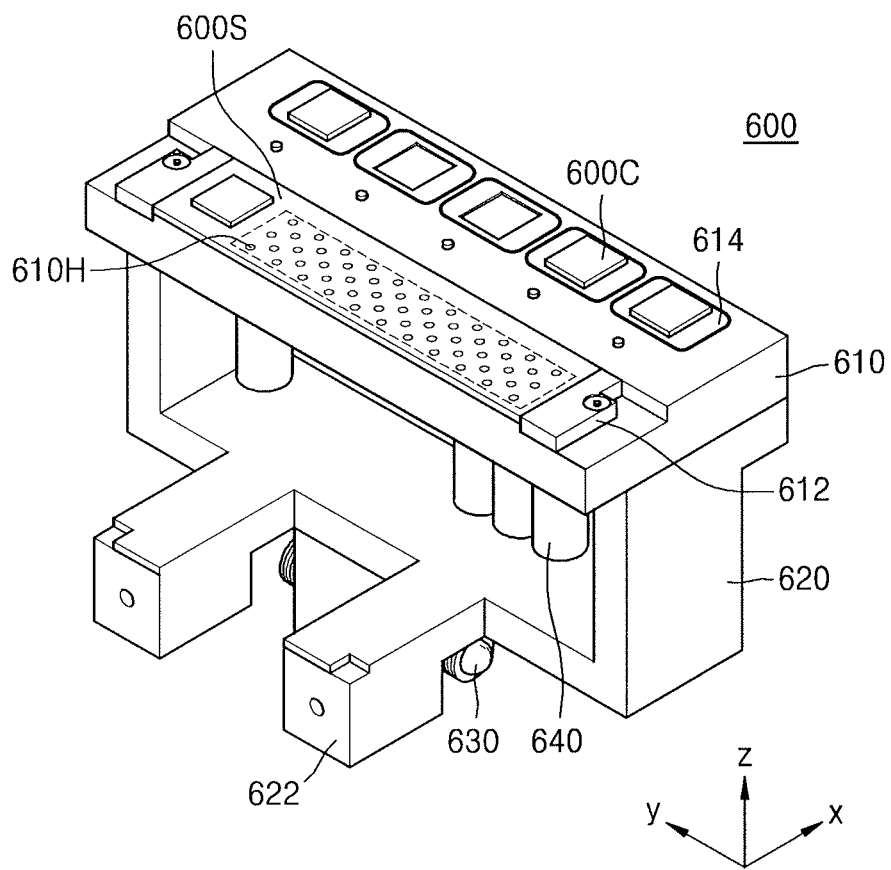
FIG. 3 illustrates a perspective view of a correction device structure, which is an element of a semiconductor chip bonding apparatus, according to an exemplary.

The correction device structure 600 may be fixed at and connected to a first side surface of the bonding stage 500. The correction device structure 600 may be formed on the first side surface of the bonding stage 500, which is disposed in the first direction, e.g., in the X direction. The correction device structure 600 may include a correction chip 600C, a correction substrate 600S, a fixing unit 610, and a body unit 620 (FIGS. 2 and 3). The correction device structure 600 will be described in detail below with reference to FIGS. 2 and 3.

The first camera C1 may be formed under a transfer path of the bonding head 400. That is, the first camera C1 may be formed under the second transfer device 130. The first camera C1 may be an up-looking camera, in which a lens unit is disposed on the base unit 110 and oriented toward the bonding head 400, and is capable of capturing images in an upward direction. The first camera C1 captures images of the semiconductor chip 230 that is adsorptively, e.g., by suction, picked up by the bonding head 400, and obtains positional information.

In detail, the first camera C1 captures images showing whether a center of the adsorption head 420 coincides, e.g., aligns, with a center of the semiconductor chip 230. If the center of the adsorption head 420 does not coincide with that of the semiconductor chip 230, the first camera C1 captures and determines a distance by which the center of the adsorption head 420 deviates from the center of the semiconductor chip 230, and an angle at which the semiconductor chip 230 deviates from the adsorption head 420. For example, the first camera C1 may capture an image of only one point of a bottom surface of the moved semiconductor chip 230, and determine in accordance with the only one point a deviated extent of the semiconductor chip 230 and an amount of displacement of the semiconductor chip 230 in a specific direction based on initially input positional information regarding the semiconductor chip 230. However, embodiments are not limited thereto, e.g., the first camera C1 may capture images of at least two points of the bottom surface of the moved semiconductor chip 230 to extract further precise images and corresponding information. For example, the first camera C1 may be a time-delayed integration (TDI) camera.

The second camera C2 may be connected to the second transfer device 130 and formed apart from the bonding head 400. A lens unit of the second camera C2 may be formed to be oriented toward the bonding stage 500. The second camera C2 may be connected to the second transfer device 130 and move in the second direction, e.g., in the Y direction. The second camera C2 captures an image of the semiconductor substrate 510 on the bonding stage 500 and obtains information regarding a bonding position of the semiconductor substrate 510 on which the semiconductor chip 230 will be mounted.

The semiconductor chip bonding apparatus 1000 according to the exemplary embodiment may be characterized by including the correction device structure 600. In detail, the semiconductor chip bonding apparatus 1000 may include the correction device structure 600 fixed and connected to the first side surface of the bonding stage 500. The semiconductor chip bonding apparatus 1000 may correct a bonding position of a semiconductor chip in real-time using the correction chip 600C and the correction substrate 600S of the correction device structure 600. Thus, it is unnecessary to stop the semiconductor chip bonding apparatus 1000, and an additional process of reducing a temperature of the semiconductor chip bonding apparatus 1000 may be omitted. The correction process will be described in detail later with reference to FIGS. 4 through 6.

FIG. 2 illustrates an enlarged perspective view of the bonding stage 500 and the correction device structure 600 of the semiconductor chip bonding apparatus 1000, and FIG. 3 is a perspective view of the correction device structure 600.

Referring to FIG. 2, the semiconductor substrate 510 may be formed on a top surface of the bonding stage 500, and the correction device structure 600 may be fixed and connected to the first side surface of the bonding stage 500. The semiconductor substrate 510 may be formed of at least one of a ceramic substrate, a PCB, an organic substrate, and an interposer substrate. For example, the semiconductor substrate 510 may be a PCB. The correction device structure 600 may be connected to the first side surface of the bonding stage 500 in the first direction, e.g., in the X direction. The correction device structure 600 and the bonding stage 500 may be connected to each other by a connection unit 622. The bonding stage 500 and the correction device structure 600 may be connected to the first transfer device 120 (FIG. 1)m and may transferred as a unified type, e.g., transferred simultaneously as a single unit.

Referring to FIGS. 2 and 3, the correction device structure 600 may include the fixing unit 610, the body unit 620, the connection unit 622, a vacuum generator 630, a cooling unit 640, the correction chip 600C, and the correction substrate 600S.

The body unit 620 may be unified with the connection unit 622. The connection unit 622 may be connected to and fixed at one side surface portion of the bonding stage 500. The bonding stage 500 may be connected to the body unit 620 by the connection unit 622.

The fixing unit 610 may be formed on the body unit 620, and may securely hold, i.e., vacuumly adsorb and support, the correction chip 600C and the correction substrate 600S thereon. In detail, a plurality of adsorption holes 610H may be formed between a top surface of the fixing unit 610 and a bottom surface of the correction substrate 600S. For example, as illustrated in FIGS. 2-3, the plurality of adsorption holes 610H may be formed through a predetermined portion of the fixing unit 610, and the correction substrate 600S may be positioned on the predetermined portion of the fixing unit 610 to cover, e.g., overlap, the plurality of adsorption holes 610H. In an embodiment, since the correction substrate 600S is a glass jig formed of a transparent material, the adsorption holes 610H may be seen through the correction substrate 600S. The adsorption holes 610H may be openings through which air pressure generated by the vacuum generator 630 passes. The adsorption holes 610H may be connected to a space formed in the fixing unit 610 and to a cooling piping unit, and may be in fluid communication with the vacuum generator 630. The adsorption holes 610H may communicate with and be connected to the vacuum generator 630, so that vacuum adsorptive power can be transmitted to the adsorption holes 610H. Accordingly, the fixing unit 610 may adsorptively support the correction substrate 600S through the adsorption holes 610H, e.g., through vacuum suction.

A correction substrate fixing member 612 may be formed on a top surface of the fixing unit 610 and on two side surfaces of the fixing unit 610 disposed in the second direction, e.g., in the Y direction. The correction substrate fixing member 612 may be disposed adjacent to two side surface portions of the correction substrate 600S and fix and support the correction substrate 600S. For example, as illustrated in FIG. 3, as the fixing unit 610 may have a step structure, the correction substrate 600S may be on the top surface of a lower portion of the step structure and abutted against a side surface of a higher portion of the step structure, such that one fixing member 612 may be simultaneously on the lower portion of the step structure and in direct contact with the side surface of the higher portion of the step structure and a side surface of the correction substrate 600S.

Figure 8:
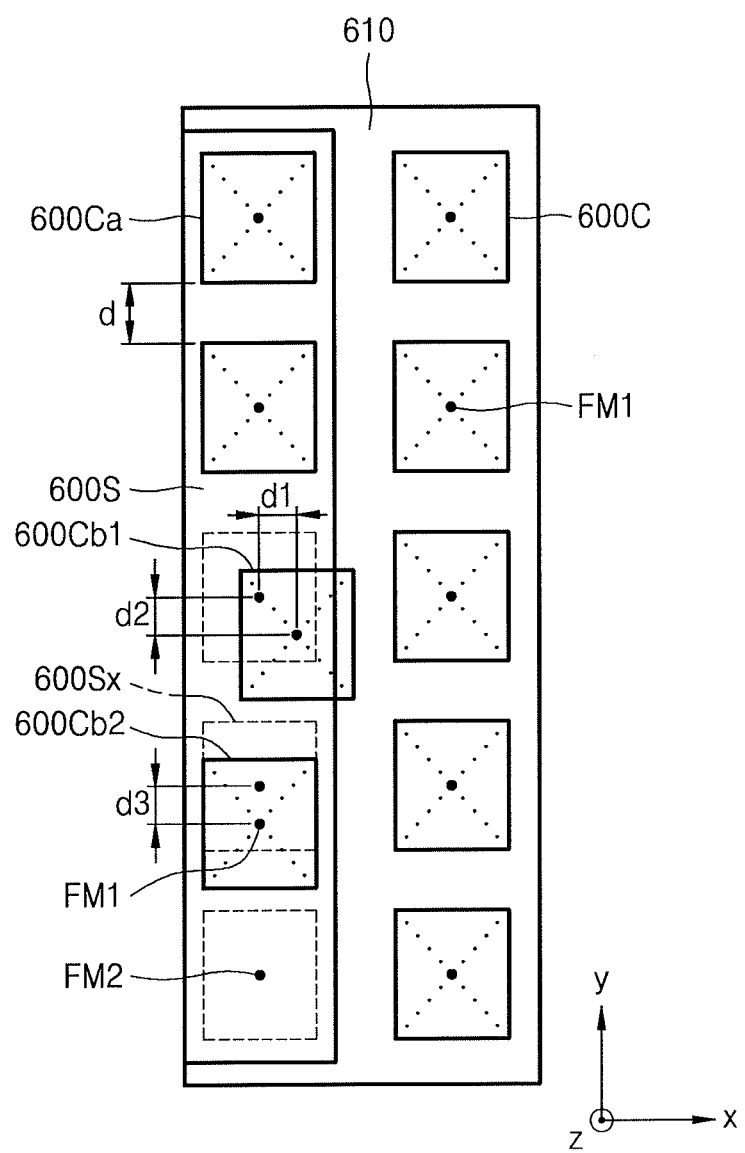
FIG. 8 illustrates an enlarged plan view of some elements of a semiconductor chip bonding apparatus according to an exemplary embodiment.

The correction substrate 600S may be adhered onto and supported by the fixing unit 610. The correction substrate 600S may be formed of glass or a resin material, e.g., a transparent resin material. For example, the correction substrate 600S may be a glass jig. A correction fiducial mark FM may be indicated on the correction substrate 600S (FIG. 8).

Figure 6:
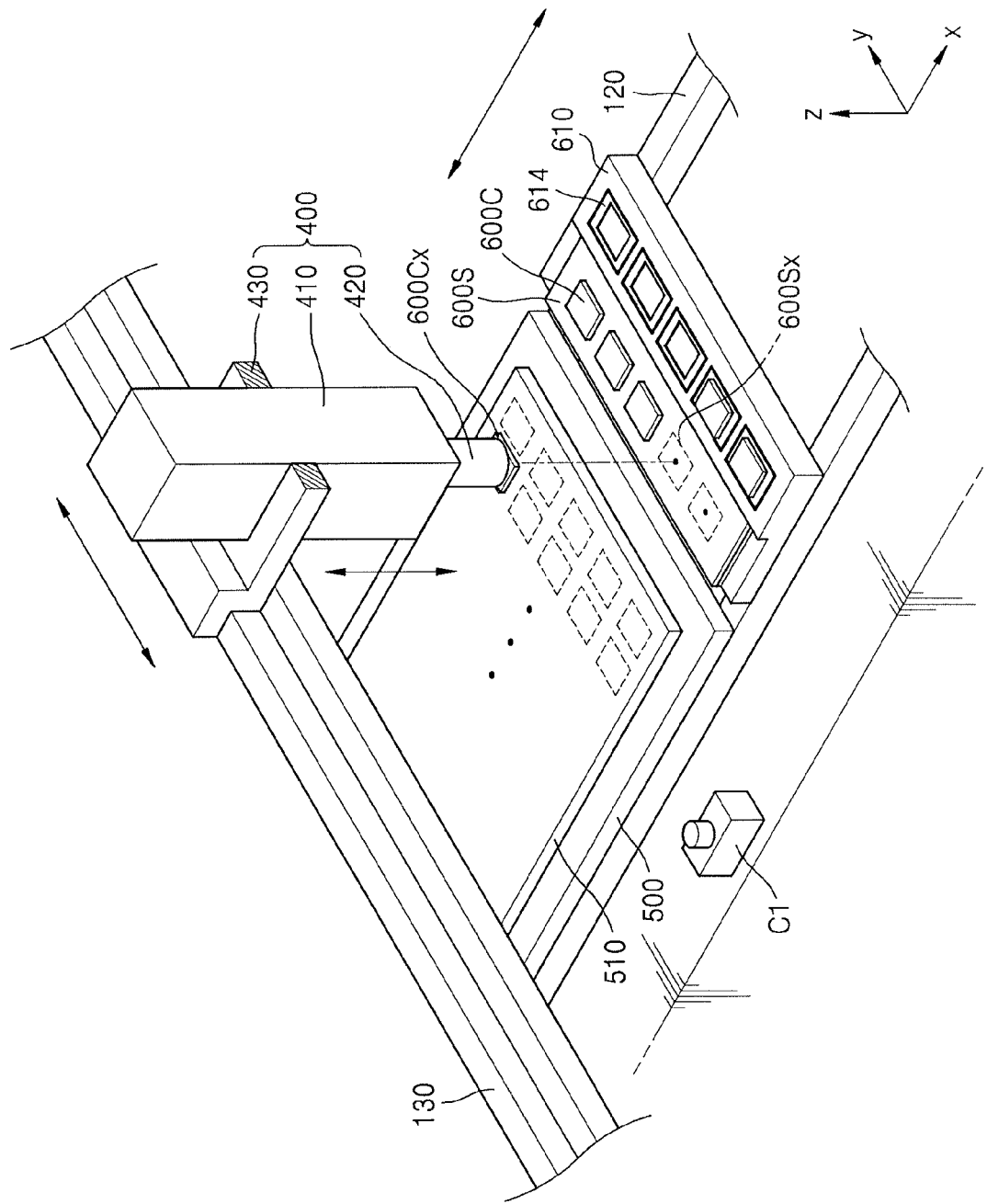
FIG. 6 illustrates an enlarged view of some elements of a semiconductor chip bonding apparatus according to an exemplary embodiment.

The correction substrate 600S may be formed to extend in the second direction, e.g., in the Y direction. The correction chips 600C may be disposed in a row on the correction substrate 600S in the second direction, e.g., in the Y direction. In an embodiment, correction chip mounting regions may be arranged in a row on the correction substrate 600S in the second direction, e.g., in the Y direction (FIGS. 6 and 8).

The correction chips 600C may be arranged in a row on the fixing unit 610 in the second direction, e.g., in the Y direction. The correction chip 600C may be adsorptively supported on the fixing unit 610 by vacuum, and may be detachable from the fixing unit 610. A plurality of correction chips 600C may be formed of glass or a transparent resin material on the fixing unit 610. The correction chip 600C may be formed of the same material as the correction substrate 600S, e.g., the correction chip 600C may include a glass jig. A correction chip supporting member 614 may be interposed between the correction chip 600C and the fixing unit 610. The correction chip supporting member 614 may be formed to surround respective side surfaces of the correction chip 600C. The correction chip supporting member 614 may fix and support the correction chip 600C, such that the correction chip 600C is aligned in the first direction, e.g., in the X direction, and in the second direction, e.g., in the Y direction.

The vacuum generator 630 may be formed under the body unit 620, and may be adjacent to a side surface portion of the connection unit 622. The vacuum generator 630 may be connected to the cooling unit 640 through a cooling piping unit formed in the body unit 620. The vacuum generator 630 may retrieve a cooling fluid flowing through the cooling unit 640 and generate vacuum. The correction chip 600C and the correction substrate 600S may be adsorbed and fixedly supported due to the vacuum generated by the vacuum generator 630. In an embodiment, the vacuum generator 630 may generate a vacuum of about (−70) kPa.

The cooling unit 640 may be formed between a bottom surface of the fixing unit 610 and a top surface of the body unit 620. The cooling unit 640 may have a cylindrical piping shape. The cooling unit 640 may contain a cooling fluid flowing through the cooling piping unit formed in the fixing unit 610. While flowing through the cooling piping unit formed in the fixing unit 610, the cooling fluid may prevent heat generated by the bonding stage 500 from being transmitted to the correction device structure 600.

Figure 4:
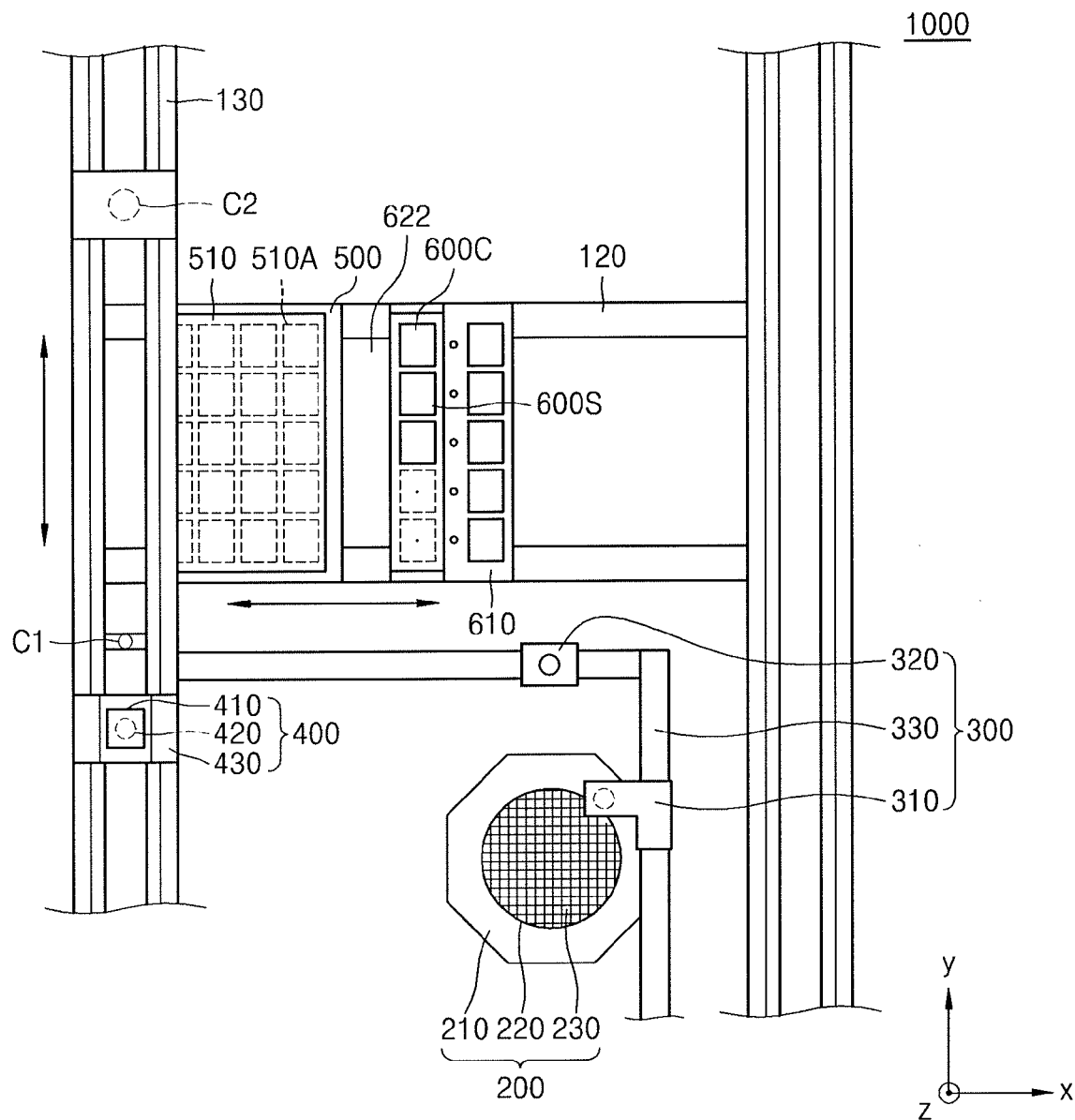
FIG. 4 illustrates a plan view of a semiconductor chip bonding apparatus according to an exemplary embodiment.
Figure 5:
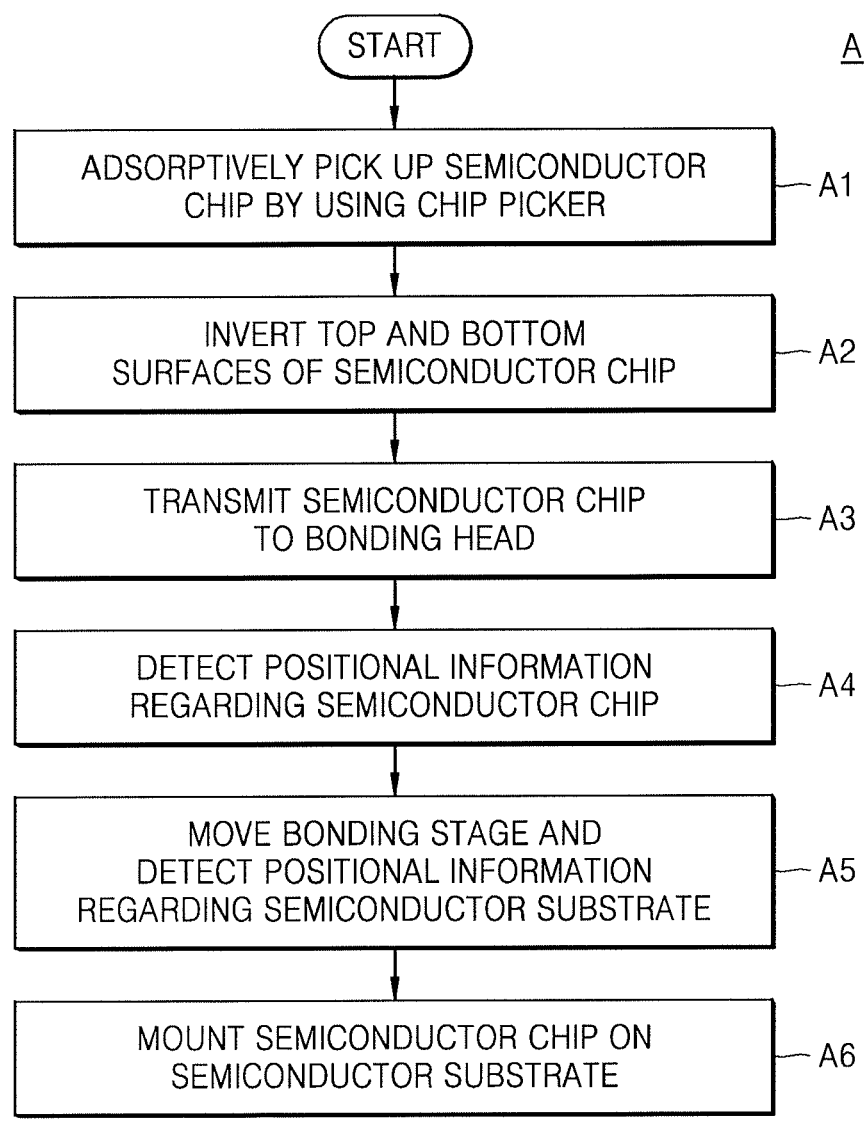
FIG. 5 illustrates a flowchart of a bonding method using a semiconductor chip bonding apparatus according to an exemplary embodiment.

FIG. 4 illustrates a plan view of some elements of the semiconductor chip bonding apparatus 1000 for explaining a bonding process and a correction process according to an exemplary embodiment. In FIG. 4, some elements may be omitted or exaggerated for brevity. FIG. 5 is a flowchart of a semiconductor chip bonding process using the semiconductor chip bonding apparatus 1000.

Figure 7:
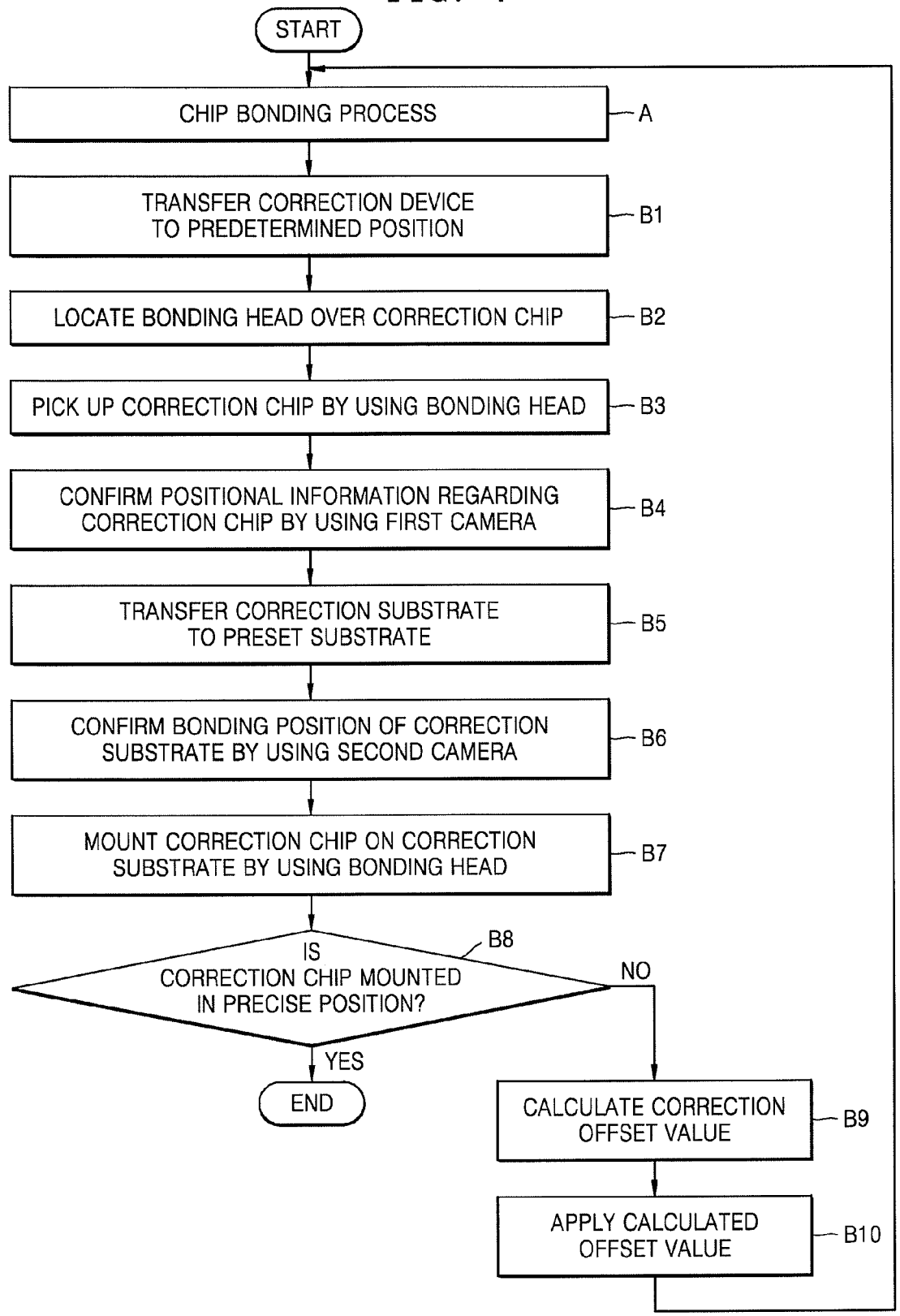
FIG. 7 illustrates a flowchart of a correcting process of a semiconductor chip bonding apparatus according to an exemplary embodiment.

Referring to FIGS. 1 and 4-5, the semiconductor chip bonding apparatus 1000 performs a chip bonding process A and a bonding position correcting process B (FIGS. 6-7).

The chip bonding process A may be a process of mounting each of the semiconductor chips 230 in a mounting region of the semiconductor substrate 510 by adsorptively picking up each of the semiconductor chips 230 from the semiconductor wafer 220 that is cut into a plurality of unit semiconductor chips 230 using a sawing machine. In detail, the chip bonding process A may include an operation A1 of picking up the semiconductor chip 230 by adsorbing a top surface of the semiconductor chip 230 onto the chip picker 310, an operation A2 of vertically rotating, e.g., inverting, the chip picker 310 by 180° such that top and bottom surfaces of the semiconductor chip 230 are inverted, an operation A3 of transmitting, e.g., transferring, the semiconductor chip 230 picked up by the chip picker 310 to the bonding head 400 using the chip picker 310, an operation A4 of inspecting a pickup position of the semiconductor chip 230, an operation A5 of moving the bonding head 400 to the bonding stage 500 and detecting a mounting position of the semiconductor substrate 510 formed on the bonding stage 500, and an operation A6 of mounting and bonding the semiconductor chip 230 to the semiconductor substrate 510.

In detail, the semiconductor wafer 220 on the wafer stage 210 may be cut into discrete, e.g., individual, unit semiconductor chips 230 using a sawing machine. The process of cutting the semiconductor wafer 220 may be performed before the operation A1 of adsorptively picking up the semiconductor chip 230 by the chip picker 310. The semiconductor chips 230 may be transmitted to the chip transport unit 320 by the chip picker 310. The chip picker 310 may include a flip head. The chip picker 310 may invert the top and bottom surfaces of the semiconductor chip 230 by 18020 and transmit the inverted semiconductor chip 230 to the chip transport unit 320. The chip transport unit 320 may be connected to the third transfer device 330 and transferred toward the bonding head 400 in the first direction, e.g., the X direction. The third transfer device 330 may include a shaft motor, and the chip transport unit 320 may be transferred, e.g., moved, toward the bonding head 400 due to the driving of the shaft motor.

The bonding head 400 may include the bonding picker 410, the adsorption head 420, and the connection member 430. The bonding picker 410 may include a vacuum unit and a heating unit. Due to vacuum generated by the vacuum unit, the bonding head 400 may adsorptively, e.g., by suction, pick up the semiconductor chip 230 from the chip transport unit 320. The adsorption head 420 may be interposed between the bonding picker 410 and the semiconductor chip 230. The bonding head 400 may be connected to the second transfer device 130 and move in the second direction, e.g., in the Y direction, toward the first transfer device 120. In this case, after the bonding head 400 picks up the semiconductor chip 230, the first camera C1 captures an image of the position of the semiconductor chip 230 on the adsorption head 420, and obtains information regarding the position of, e.g., the center of, the semiconductor chip 230 relative to, e.g., the center of, the adsorption head 420.

The bonding stage 500 may be connected to the first transfer device 120 and move in the first direction, e.g., in the X direction. The semiconductor substrate 510 may be disposed on the bonding stage 500. A semiconductor chip mounting region 510A may be formed on the semiconductor substrate 510, as illustrated in FIG. 4. The bonding stage 500 may be transferred, e.g., moved, along the first transfer device 120 in the first direction, such that the bonding head 400 on the second transfer device 130 overlaps the semiconductor chip mounting region 510A. In this case, the second camera C2 captures an image of the semiconductor chip mounting region 510A and obtains positional information regarding the semiconductor chip mounting region 510A. The second camera C2 may be connected to the second transfer device 130 and move in the second direction, e.g., in the Y direction, to capture an image of the semiconductor chip mounting region 510A.

Once the bonding head 400 and the semiconductor chip mounting region 510A overlap, the bonding head 400 may move downward in the third direction, e.g., in the Z direction, to position, e.g., mount, the semiconductor chip 230 on a corresponding semiconductor chip mounting region 510A of the semiconductor substrate 510. The bonding head 400 may apply pressure to the semiconductor chip 230 so that the semiconductor chip 230 may be bonded under pressure to the semiconductor chip mounting region 510A. When the semiconductor chip 230 is bonded under pressure, the bonding head 400 may heat the bonding stage 500 so that the semiconductor chip 230 may be bonded by heating under pressure to the semiconductor chip mounting region 510A.

When the above-described semiconductor chip bonding process A is repeated, the temperature of the semiconductor chip bonding apparatus 1000 may be increased, and the first transfer device 120 and the second transfer device 130 may be moved by the shaft motor, thereby degrading a bonding precision. Accordingly, a high-precision bonding process requires the correction device structure 600 according to embodiments for correcting minute variations caused by environmental changes, e.g., high temperature and operational inaccuracy, as will be described in more detail below with reference to FIGS. 6-7.

FIG. 6 illustrates an enlarged view of some elements of the semiconductor chip bonding apparatus 1000 according to an exemplary embodiment. In FIG. 6, some elements may be omitted or exaggerated for brevity. FIG. 7 is a flowchart of a correcting process (B1 to B10) of the semiconductor chip bonding apparatus 1000 according to an exemplary embodiment.

Referring to FIGS. 6 and 7, the chip mounting position correcting process (B1 to B10) may be performed subsequently after the chip bonding process A, or may be performed at the same time as the chip bonding process A in real-time. For example, the chip mounting position correcting process (B1 to B10) may be periodically performed during the chip bonding process A. For example, the chip mounting position correcting process (B1 to B10) may be performed under specific conditions based on time, e.g., after the chip bonding process A is performed for a predetermined number of minutes, or based on production, e.g., after a predetermined number of semiconductor chips 230 are bonded.

The chip mounting position correcting process (B1 to B10) may include an operation B1 of transferring the correction device structure 600 to a predetermined position, an operation B2 of transferring the bonding head 400 to be located over the correction chip 600C, an operation B3 of adsorptively picking up the correction chip 600C by using the bonding head 400, an operation B4 of capturing an image of the correction chip 600C using the first camera C1 and obtaining positional information regarding the correction chip 600C, an operation B5 of transferring the correction substrate 600S to a predetermined position, an operation B6 of capturing an image of the correction substrate 600S by using the second camera C2 and obtaining positional information regarding a mounting position 600Sx of the correction substrate 600S, an operation B7 of mounting the correction chip 600C on the correction substrate 600S by using the bonding head 400, an operation B8 of determining whether the correction chip 600C has precisely been mounted in the mounting position 600Sx of the correction substrate 600S, an operation B9 of calculating a correction offset value, and an operation B10 of applying the calculated offset value.

In detail, the correction device structure 600 may be transferred to a predetermined position. The predetermined position may refer to a position in which the adsorption head 420 of the bonding head 400 coaxially overlaps the correction chip 600C. That is, the adsorption head 420 may be disposed over the correction chip 600C. The correction device structure 600 may be connected to the bonding stage 500, so the correction device structure 600 with the bonding stage 500 may be transferred, e.g., moved, simultaneously along the first transfer device 120 until the adsorption head 420 is aligned over a corresponding correction chip 600C. The correction device structure 600 may be transferred, e.g., moved, in the first direction, e.g., in the X direction.

The connection member 430 may include an elevating motor. The connection member 430 may move the bonding picker 410 downward in the third direction, e.g., in the Z direction, due to the driving of the elevating motor, and may locate, e.g., position, the bonding picker 410 onto, e.g., above, the correction chip 600C. The bonding picker 410 may adsorptively pick up the correction chip 600C.

After picking up the correction chip 600C, the connection member 430 may move the bonding picker 410 upward in the third direction, e.g., in the Z direction, and may be transferred toward the first camera C1 along the second direction, e.g., along the Y direction. That is, the bonding head 400 including the connection member 430 may be connected to the second transfer device 130 and move in the second direction, e.g., in the Y direction, so the first camera C1 may capture an image of the correction chip 600C relative to the adsorption head 420, i.e., to obtain positional information regarding the correction chip 600C.

Thereafter, the correction device structure 600 may move in the first direction, e.g., in the X direction, such that the correction substrate 600S is disposed under the bonding head 400. In this case, the second camera C2 may be transferred in the second direction, e.g., in the Y direction, by the second transfer device 130, capture an image of the correction substrate 600S, and obtain positional information regarding the mounting position 600Sx of the correction substrate 600S.

The bonding head 400 may mount the correction chip 600C, which is transferred to the second transfer device 130 and picked up, in the mounting position 600Sx of the correction substrate 600S. The mounting positions 600Sx of the correction substrate 600S may be arranged in a row in the second direction, e.g., in the Y direction. Although FIG. 6 illustrates five mounting positions 600Sx for brevity, embodiments are not limited thereto. A plurality of correction chips 600C may be mounted in the mounting positions 600Sx. By calculating a distance between the mounted correction chips 600C, it may be detected whether the correction chips 600C are precisely mounted in the mounting positions 600Sx. The correction fiducial mark FM may be indicated on the correction chip 600C and the mounting position 600Sx of the correction substrate 600S, as will be described in more detail below with reference to FIG. 8.

The semiconductor chip bonding apparatus 1000 may include a controller 700. The controller 700 may control the first transfer device 120 and the second transfer device 130, and may preset amount of motions of the bonding head 400 and the correction device structure 600. Also, the controller 700 may obtain and store positional information regarding the correction chip 600C and the mounting position 600Sx of the correction substrate 600S, of which images are captured by the first camera C1 and the second camera C2.

In addition, the controller 700 may perform an algorithm for detecting whether the correction chip 600C is mounted on the mounting position 600Sx such that the chip fiducial mark FM1 (FIG. 8) of the correction chip 600C precisely coincides with a substrate fiducial mark FM2 (FIG. 8) of the mounting position 600Sx, and may calculate a correction offset value. In detail, the controller 700 may detect an amount of motion accompanying the chip fiducial mark FM1, of which an image is captured by the first camera C1, compare the chip fiducial mark FM1 with the substrate fiducial mark FM2, of which an image is captured by the second camera C2, recognize an amount of deviation, and calculate a correction offset value. A method of correcting a chip mounting position by calculating the correction offset value based on the chip fiducial mark FM1 and the substrate fiducial mark FM2 will be described later with reference to FIG. 8.

After the chip mounting position correcting process (B1 to B9) is performed, the correction offset value may be applied to the chip bonding process A. The semiconductor chip bonding apparatus 1000 according to an exemplary embodiment may be configured by disposing the correction device structure 600 on one side surface of the bonding stage 500. Thus, the semiconductor chip bonding apparatus 1000 may detect a bonding precision of the semiconductor chip 230 during the chip bonding process A or periodically detect the bonding precision of the semiconductor chip 230. When the semiconductor chip 230 is not precisely mounted in the mounting position 510A on the semiconductor substrate 510, the semiconductor chip bonding apparatus 1000 may immediately apply a correction offset value by using the controller 700. That is, the semiconductor chip bonding apparatus 1000 may correct the position of the semiconductor chip 230 in the mounting position 510A by using the correction chip 600C under the same conditions and in the same environments as the semiconductor chip bonding apparatus 1000 to increase precision. Also, since it is unnecessary to drop an internal temperature of the semiconductor chip bonding apparatus 1000, time taken to perform the correcting process may be reduced.

FIG. 8 illustrates an enlarged plan view of the correction chip 600C, the correction substrate 600S, and the fixing unit 610 of the correction device structure 600.

Referring to FIG. 8, the correction chip 600C and the correction substrate 600S may be fixed onto the fixing unit 610 and supported. In an embodiment, the fixing unit 610 may adsorptively support the correction chip 600C and the correction substrate 600S by vacuum generated by the vacuum generator 630 (FIG. 2). The correction chip 600C and the correction substrate 600S may be formed of glass or a transparent resin material.

The correction chip 600C may be spaced apart from a side surface of the correction substrate 600S in the first direction, e.g., in the X direction, and arranged in the second direction, e.g., in the Y direction. The chip fiducial mark FM1 may be formed on the correction chip 600C. The chip fiducial mark FM1 may be formed on a top surface of the correction chip 600C, and is indicated on a surface opposite to the first camera C1.

The chip fiducial mark FM1 may have a circular dot shape. However, a shape of the chip fiducial mark FM1 is not limited to a circular shape and may have any one of a cross shape, a polygonal shape, or a combination thereof. In an embodiment, the chip fiducial mark FM1 may have a shape of a combination of a circular shape and a cross shape. The chip fiducial mark FM1 may be a fiducial point for calculating relative positional information including a distance between the plurality of correction chips 600C. When the chip fiducial mark FM1 has a combination of a circular shape, a cross shape, or a polygonal shape, relative positional information between the correction chips 600C may be calculated based on the center of the chip fiducial mark FM1.

The plurality of mounting positions 600Sx may be formed on the correction substrate 600S. In an embodiment, five mounting positions 600Sx may be formed. However, the number of the mounting positions 600Sx is not limited to five. The correction chips 600C may be mounted on the plurality of mounting positions 600Sx. The shape and size of the plurality of mounting positions 600Sx may be equal to the shape and size of the correction chips 600C. The substrate fiducial mark FM2 may be formed in each of the plurality of mounting positions 600Sx. The substrate fiducial mark FM2 may be formed in a central portion of each of the plurality of mounting positions 600Sx.

Normal mounting chips 600Ca and abnormal mounting chips 600Cb1 and 600Cb2 may be mounted on the plurality of mounting positions 600Sx. The normal mounting chips 600Ca refer to chips precisely mounted in the respective mounting positions 600Sx. Normal mounting may indicate that the chip fiducial mark FM1 precisely coincides, i.e., aligns, with the substrate fiducial mark FM2. The normal mounting chips 600Ca may be spaced a predetermined distance "d" apart from one another, e.g., the distance "d" may be about 10 mm.

The abnormal mounting chips 600Cb1 and 600Cb2 may refer to chips imprecisely mounted in the respective mounting position 600Sx. For example, as a chip fiducial mark FM1 of a first abnormal mounting chip 600Cb1 is spaced apart from its corresponding substrate fiducial mark FM2 by a first alignment deviation d1 in the first direction (X direction) and spaced apart from the substrate fiducial mark FM2 by a second alignment deviation d2 in the second direction (Y direction), the first abnormal mounting chip 600Cb1 is imprecisely mounted in its respective mounting position 600Sx. In another example, as a chip fiducial mark FM1 of the second abnormal mounting chip 600Cb2 is spaced apart from its corresponding substrate fiducial mark FM2 by a third alignment deviation d3 in the second direction (Y direction), the second abnormal mounting chip 600Cb2 is imprecisely mounted in its respective mounting position 600Sx.

The semiconductor chip bonding apparatus 1000 according to an exemplary embodiment may include mounting the correction chip 600C on the correction substrate 600S, detect alignment deviations, e.g., the first alignment deviation d1 to the third alignment deviation d3, of the abnormal mounting chips 600Cb1 and 600Cb2, and correct a bonding position. In detail, the semiconductor chip bonding apparatus 1000 may pick up the correction chip 600C by using the bonding head 400, mount the correction chip 600C on the correction substrate 600S, and detect whether the correction chip 600C is precisely mounted in the mounting position 600Sx. Thereafter, in the case of the abnormal mounting chips 600Cb1 and 600Cb2, the semiconductor chip bonding apparatus 1000 may calculate a correction offset value for offsetting and removing the alignment deviations, e.g., the first alignment deviation d1 to the third alignment deviation d3, and apply the correction offset value to the chip bonding process A in FIG. 5. The calculation of the correction offset value may be performed, e.g., continuously, during the chip bonding process A of the semiconductor chip bonding apparatus 1000 or periodically performed. Accordingly, a bonding precision and accuracy of the chip bonding process A of the semiconductor chip bonding apparatus 1000 may be increased by applying the correction offset value.

The methods and processes described herein may be performed by code or instructions to be executed by a computer, processor, manager, or controller. Because the algorithms that form the basis of the methods (or operations of the computer, processor, or controller) are described in detail, the code or instructions for implementing the operations of the method embodiments may transform the computer, processor, or controller into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

By way of summary and review, in a conventional contact connection method using a wire bonding process, a bonding precision of several tens of μm is sufficient for the semiconductor chip bonding process. However, in a process of bonding flip-chips, i.e., bonding via TSVs, by bringing bumps into direct contact with pads requires a higher precision, e.g., several μm.

Also, as the process of bonding the flip-chips involves directly connecting metals, relatively high temperature and pressure are required. However, in a high-precision semiconductor chip bonding apparatus, minute variations in environment conditions, e.g., temperature, may degrade the precision of the semiconductor chip bonding process.

Therefore, according to example embodiments, a semiconductor chip bonding apparatus includes a correction chip and a correction substrate for correcting a position in which a semiconductor chip is bonded onto a substrate. As such, a bonding position may be corrected in real-time without stopping the semiconductor chip bonding apparatus, even when the temperature in the semiconductor chip bonding process is varied.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A semiconductor chip bonding apparatus, comprising:
a bonding head to adsorptively pick up a semiconductor chip;
a bonding stage supporting a substrate, the semiconductor chip to be bonded to the substrate on the bonding stage;
a first camera to capture an image of the semiconductor chip and to obtain positional information regarding the semiconductor chip;
a second camera to capture an image of the substrate and to obtain positional information regarding the substrate;
a correction device structure at a first side surface of the bonding stage, the correction device structure including a correction substrate and at least one correction chip; and
a bonding controller to control pick up of the at least one correction chip by the bonding head, mounting of the at least one correction chip on the correction substrate, and correcting of a bonding position.

2. The apparatus as claimed in claim 1, wherein the correction device structure further comprises:
a fixing unit, the at least one correction chip and the correction substrate being positioned on and fixed to the fixing unit; and
a body unit connected to one side of the bonding stage.

3. The apparatus as claimed in claim 2, wherein the correction device structure further comprises a fixing member on two side surfaces of the correction substrate in a first direction, the fixing member fixing the correction substrate.

4. The apparatus as claimed in claim 2, wherein the correction device structure further comprises a cooling unit between the fixing unit and the body unit, the cooling unit cooling the correction chip and the correction substrate.

5. The apparatus as claimed in claim 2, wherein the at least one correction chip and the correction substrate are adsorptively supported by the correction device structure, the at least one correction chip and the correction substrate being detachable from the fixing unit.

6. The apparatus as claimed in claim 1, wherein a plurality of correction chips are positioned on the correction substrate, regions of the correction substrate accommodating the plurality of correction chips are arranged in a row in a first direction.

7. The apparatus as claimed in claim 1, wherein the at least one correction chip and the correction substrate include a transparent material.

8. The apparatus as claimed in claim 1, further comprising a first transfer device connected to the bonding head and to the second camera, the first transfer device transferring the bonding head and the second camera in a first direction.

9. The apparatus as claimed in claim 8, wherein the first transfer device has a gantry structure, and the first camera is an up-looking camera disposed under the first transfer device to capture images in an upward direction.

10. The apparatus as claimed in claim 8, further comprising a second transfer device connected to the bonding stage and to the correction device structure, the second transfer device transferring the bonding stage and the correction device structure in a second direction perpendicular to the first direction.

11. A method of operating a semiconductor chip bonding apparatus, the method comprising:
adsorptively picking up semiconductor chips with a bonding head;
mounting the semiconductor chips on a semiconductor substrate disposed on a bonding stage;
correcting positions of the semiconductor chips on the semiconductor substrate; and
applying heat and pressure to the semiconductor chips, such that the semiconductor chips are bonded to the semiconductor substrate,
wherein correcting positions of the semiconductor chip, includes:
transferring the bonding head to face an upper portion of a correction chip,
adsorptively picking up the correction chip with the bonding head,
obtaining positional information regarding the correction chip by capturing an image of the correction chip with a first camera,
transferring a correction substrate formed on one side surface of the bonding stage to a predetermined position,
obtaining information regarding a mounting position of the correction substrate by capturing an image of the mounting position of the correction substrate with a second camera,
mounting the correction chip in the mounting position of the correction substrate with the bonding head,
determining whether the correction chip is precisely mounted in the mounting position of the correction substrate, and
calculating a correction offset value when the correction chip is not precisely mounted on the correction substrate to correct chip mounting positions.

12. The method as claimed in claim 11, wherein correcting positions of the semiconductor chip is performed periodically during the picking up and mounting of the semiconductor chips.

13. The method as claimed in claim 11, further comprising applying the calculated correction offset value of the correction chip to the semiconductor chips on the semiconductor substrate.

14. The method as claimed in claim 11, wherein calculating the correction offset value is based on a distance between a fiducial mark formed in the correction chip and a fiducial mark formed in the correction substrate.

15. The method as claimed in claim 11, wherein:
the bonding head is connected to a first transfer device, and transferred by the first transfer device in a first direction, and
the bonding stage and the correction substrate are connected to a second transfer device, and transferred by the second transfer device in a second direction perpendicular to the first direction.

16. A semiconductor chip bonding apparatus, comprising:
a bonding head to adsorptively pick up a semiconductor chip;
a first camera to capture an image of the semiconductor chip on the bonding head, and to determine a position of the semiconductor chip relative to the bonding head;
a bonding stage supporting a substrate, the semiconductor chip to be bonded to the substrate on the bonding stage;

a second camera to capture an image of the substrate, and to obtain positional information regarding the substrate;

a correction device structure connected to the bonding stage, the correction device structure including a correction substrate and at least one correction chip; and a bonding controller to control mounting of the at least one correction chip on the correction substrate, calculating position precision of the correction chip on the correction substrate, and correcting a bonding position of the semiconductor chip on the substrate with respect to the calculated position precision of the correction chip on the correction substrate.

17. The apparatus as claimed in claim 16, wherein the bonding head adsorptively picks up both the semiconductor chip and the correction chip, the first camera capturing images of each of the semiconductor chip and of the correction chip relative to the bonding head.

18. The apparatus as claimed in claim 16, wherein the bonding stage and correction device structure are simultaneously movable with a same transfer device along a same direction.

19. The apparatus as claimed in claim 16, wherein the correction substrate and the at least one correction chip are transparent, each of the at least one correction chip and a mounting position on the correction substrate including a fiduciary mark.

20. The apparatus as claimed in claim 19, wherein the bonding controller calculates position precision of the correction chip on the correction substrate in accordance with the fiduciary marks on the correction chip and the correction substrate as captured by the first and second cameras, respectively.

* * * * *